United States Patent [19]

Sauer et al.

[11] 4,410,843
[45] Oct. 18, 1983

[54] ELECTRICALLY CONTROLLED SLIDING WINDOW AND PROXIMITY DETECTOR

[75] Inventors: Gerd Sauer, Stolberg-Venwegen; Dieter Unbehaun, Nuremberg, both of Fed. Rep. of Germany

[73] Assignee: Saint-Gobain Vitrage, Courbevoie, France

[21] Appl. No.: 362,038

[22] Filed: Mar. 25, 1982

[30] Foreign Application Priority Data

Mar. 25, 1981 [DE] Fed. Rep. of Germany ....... 3111724

[51] Int. Cl.³ ............................................ H01H 47/12
[52] U.S. Cl. .................................. 318/317; 219/203; 49/31; 318/466
[58] Field of Search ............... 318/317, 135, 641, 468, 318/469, 266, 466, 286; 49/31, 55, 334; 219/203

[56] References Cited

U.S. PATENT DOCUMENTS

| 2,866,881 | 12/1958 | McMillen | 219/203 |
| 3,594,547 | 7/1971 | Quinn | 219/203 |
| 3,651,389 | 3/1972 | Ito et al. | 318/466 |
| 3,982,092 | 9/1976 | Marriott | 219/203 |
| 4,351,016 | 9/1982 | Felbinger | 318/266 |

FOREIGN PATENT DOCUMENTS

| 1690298 | 8/1967 | Fed. Rep. of Germany . |
| 2939342 | 9/1981 | Fed. Rep. of Germany . |
| 2073975 | 9/1971 | France . |

Primary Examiner—J. V. Truhe
Assistant Examiner—A. Evans
Attorney, Agent, or Firm—Pennie & Edmonds

[57] ABSTRACT

Apparatus for an electrically moved sliding window, used illustratively in automotive applications, having first, a built-in safety device, for providing a signal whenever the window has been raised or lowered to a preselected height and second, a proximity detector is described. The device and detector comprise a plurality of conductors, bonded to the surface of the window. These conductors are, in turn, connected to an integrated circuit element which is also mounted to the surface of the window. This circuit element controls a power stage which, in turn, supplies power to the drive motor which raises and lowers the window. The circuit element and the conductors are placed directly on the window in a stationary position with respect to one another.

8 Claims, 8 Drawing Figures

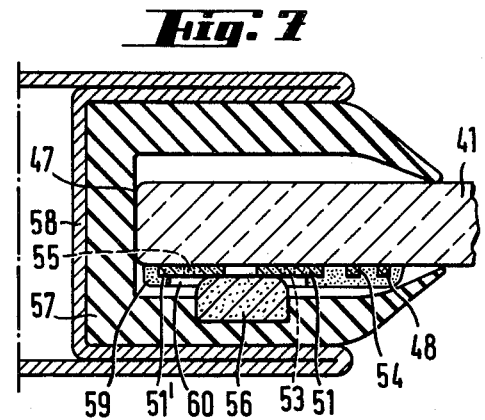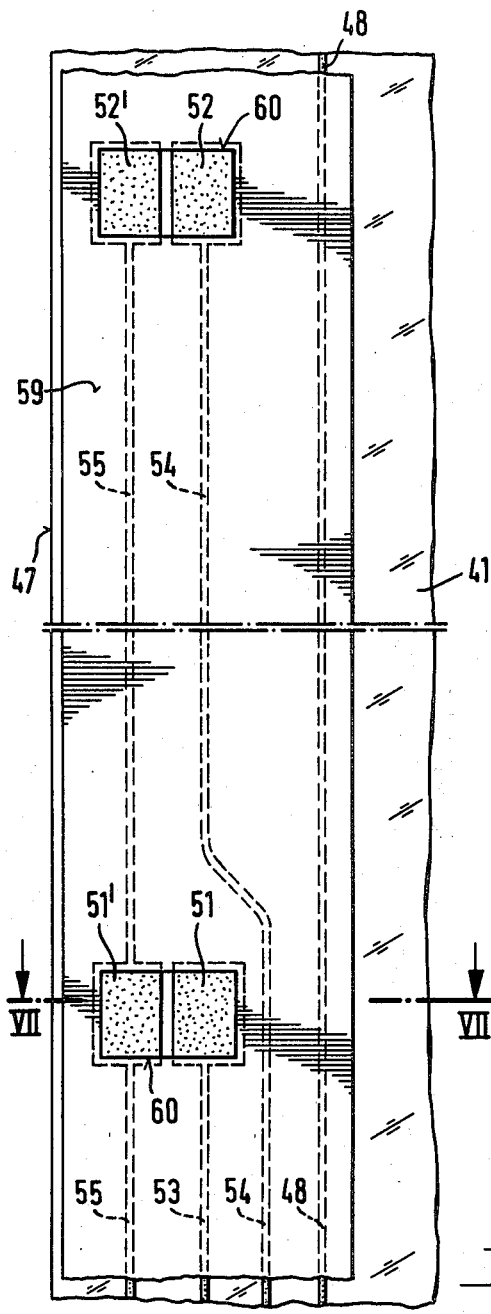

ELECTRICALLY CONTROLLED SLIDING WINDOW AND PROXIMITY DETECTOR

BACKGROUND OF THE INVENTION

1. Field of the Invention

The invention relates to a sliding window and, more particularly, to one intended for use in automobiles, and one which is raised and lowered electrically and is equipped with a safety device that includes to a proximity dectector.

2. Description of the Prior Art

U.S. Pat. No. 3,651,389 describes a sliding electrically driven vehicular window having a control circuit made up of discrete electronic elements. Because of this, the electronic control circuit is relatively bulky and, as such, must be positioned inside the door which houses the window, for example, in the vicinity of the drive motor for the window. In order to achieve a high degree of sensitivity such that control circuit can respond to contact with a clothed portion of human body, for example, a gloved hand, it is necessary to connect this circuit to a pickup mounted on the window glass by means of a shielded conductor, in particular, a coaxial cable.

Since the coaxial cable is physically attached at only its two ends, it is completely suspended between the control circuit and the pickup. Consequently, the rest of the cable, i.e., its body, swings inside the door casing whenever, for example, the window glass is raised or lowered, or whenever the door is slammed.

This type of construction disadvantageously has several drawbacks. First, there is no guarantee that an unsuitable control circuit will not be mounted in the vehicle. Specifically because of the high sensitivity of the control circuit, it is often necessary to adjust the control circuit as the time of its installation in the vehicle, to the particular values of the ohmic resistance and capacitance of the pickup to which the control circuit is to be connected in order to avoid any operating trouble. However, these values essentially depend upon the shape and dimensions of the glass and the window frame and thus often vary widely depending upon the model of the vehicle. This is true even within any given type, e.g. cars, trucks and the like. Thus, it is not sufficient to make these adjustments according to just the type of vehicle. Consequently, a control device, adjusted for one type of vehicle and thereafter installed on another, may operate in a faulty manner.

Second, the suspended cable produces another drawback. Specifically, since these cables are relatively rigid, the effect of their continual bending caused by the continual movement of the cable from, for example, normal repetitive raising and lowering of the window, will over time weaken the cable connections. This could eventually break one or both of these connections.

The final drawback is that these cables do not provide sufficient protection against the generation of spurious signals. In particular, water or at least moisture, is often found inside a door of a vehicle and as such will often penetrate the cable. This in turn disadvantageously causes capacitance variations which can cause the safety device to operate at the wrong moment. Spurious signals can also be generated from the simple movement of the cables within the body of the door, caused for example, by the door being opened or closed.

SUMMARY OF THE INVENTION

Accordingly, it is an object of the present invention to provide an arrangement for a vehicular sliding window equipped with a safety device which eliminates the risk that an improperly adjusted control circuit will be attached to the window.

It is another object of this invention to provide an arrangement for a safety device for use in a sliding vehicular window in which its operation is unaffected by the number of times the window is repetitively raised and lowered.

It is yet a further object of this invention to provide an arrangement for a safety device for use in a vehicular sliding window in which the likelihood that spurious signals will be generated is substantially reduced, if not eliminated.

These and other objects are achieved in accordance with this invention by mounting both the control circuit and the connecting line, between this control circuit and the pickup, in a stationary position with respect to one another on the window glass itself.

In accordance with a specific embodiment disclosed herein, the control circuit element is miniaturized and advantageously constructed as an integrated circuit. The connecting line and pickup are each fabricated as conductive metal strips permanently bonded to an exterior surface of the window glass at the time it is manufactured. The integrated circuit is also attached to the window glass at the same time. Advantageously, this latter operation almost totally eliminates the risk of connecting an improper control circuit to the window. In addition, the danger, that any connection to the control circuit will break, is totally eliminated. Furthermore, since this arrangement can be readily made water-tight and is insensitive to movement of the door, the likelihood that spurious signals will be generated is substantially reduced, if not eliminated.

Moreover, the invention advantageously and markedly reduces the manufacturing cost of the sliding window assembly and, more particularly, of a vehicular window equipped with a safety device.

BRIEF DESCRIPTION OF THE DRAWING

The invention may be clearly understood from a consideration of the following detailed description and accompanying drawing in which:

FIG. 6 is a magnified detailed view of the edge of a vehicular window, according to the principles of the instant invention, which exhibits a different arrangement and another structure of final contacts;

FIG. 7 is a section view taken along line VII—VII and in the direction of the arrows, both shown in FIG. 6.

DETAILED DESCRIPTION

Figure 1:
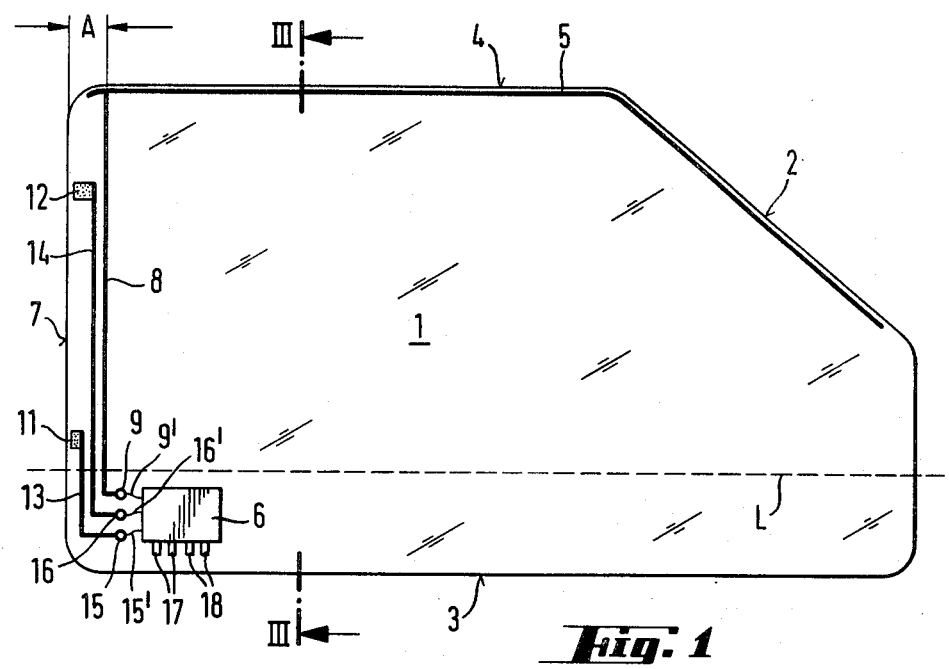
FIG. 1 is an overall view of a first version of a vehicular window which embodies the principles of the present invention.

As shown in FIG. 1, glass 1 is shaped in the form of a sliding window of a vehicle, normally that of a car door. The window can have many different shapes depending upon the model of the car. As a general rule, it is nearly rectangular, with a rounded edge 2 that corresponds to the shape of the opening of the window frame. The lower edge 3 is held in a metal shape (not shown) through which a drive motor, acting on a suitable shaft or lever (all not shown), raises and lowers the window glass. Along upper edge 4 and oblique edge 2, an electrical conductor is fused onto the inner face of the glass and forms pickup 5. This conductor has a width on the order of 0.4 to 1.0 mm and thickness on the order of 0.01 to 0.02 mm. It illustratively comprises an electrically conductive ceramic or enamel material with a silver metal base. Pickup 5 comprises the detector of a proximity detection circuit which detects the approach of any portion of a human's body and, in response thereto, prevents the window from moving any further. This pickup and its use, as well as that of the proximity detector, is fully described in our co-pending U.S. patent application entitled, "Electronic Safety Device for Controlling the Drive Motor Attached to a Sliding Window," Ser. No. 362,040, which has been filed simultaneously herewith and is incorporated by reference herein.

Pickup 5 is connected to an electronic control circuit 6, in the form of a compact element. This element is directly attached to the inner face or surface of glass 1, in its lower part which, when the window is closed, is below the edge of the door, represented by line L. Consequently, the control circuit remains invisible. This control circuit advantageously comprises a single-piece integrated circuit having small dimensions, such that the entire dimensions of element 6 are on the order of, illustratively, 60×20×4 mm.

Connecting line 8 runs along vertical edge 7 between pickup 5 and control circuit 6. Like the pickup, the connecting line is made of a conductive ceramic strip fused onto the glass, and then fired at the same time as the glass. In the vicinity of element 6, connecting line 8 ends in a broadened area 9 advantageously made up of the same material as line 8, on which a connecting wire from control circuit 6 is soldered.

Connecting line 8 runs vertically upward at a distance A, on the order of 2 to 4 cm, from the left vertical edge 7 of the glass. This distance is necessary to prevent the metal window frame (not shown), in which edge 7 rides, from having any effect on the signals carried on connecting line 8. In addition, this distance provides sufficient space in which contact areas 11 and 12 are placed. Contact areas 11 and 12 are, respectively, connected by lines 13 and 14 to broadened areas 15 and 16 from which they are connected to control circuit 6 by soldered wires 15' and 16'. These contact areas cooperate with sliding contacts, which are discussed below, placed in the window frame in order to signal the control circuit that the window is either in the upper or lower extensions of its travel. In response thereto, the control circuit removes power from the drive motor thereby preventing the window from being driven beyond the extremes of its travel.

Figure 3:
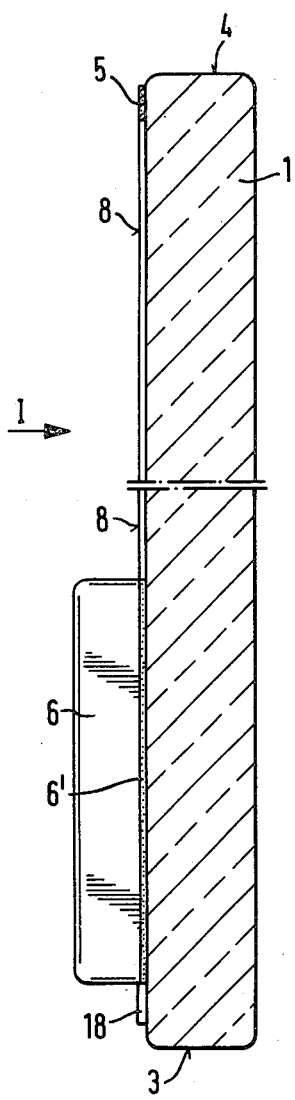
FIG. 3 is a sectional view taken along line III—III and in the direction of the arrows, both shown in FIG. 1.

Control circuit 6 has two contact plugs 17, for facilitating the connection of a power cable that comes from the battery, and two similar plugs 18, for connecting a drive signal produced by the control circuit to a power stage which applies power to the drive motor. As can be seen in FIG. 3, control circuit 6 is solidly and durably joined to the inner face of glass 1, with a layer of glue 6'. The power stage of the control circuit and its associated relay (both not shown) are advantageously placed in a stationary enclosure on the inside of the vehicle door and, preferably, on the drive motor or in its immediate vicinity.

Figure 2:
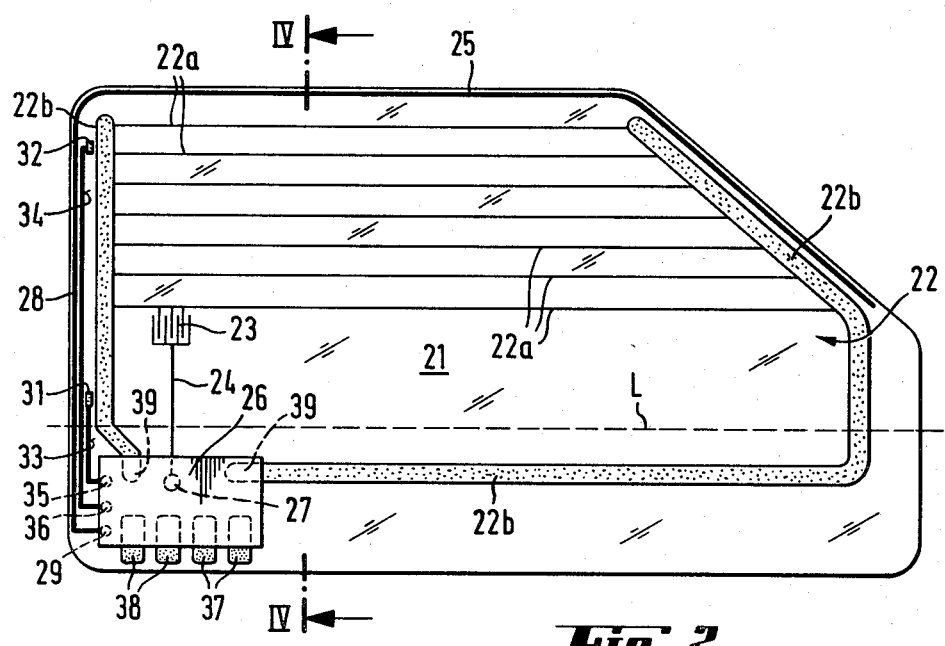
FIG. 2 is an overall view of a second version of a vehicular window which embodies the principles of the present invention.

The version represented by FIG. 2 corresponds to a heated window with an automatic control for the heater. As shown, glass 21 not only carries pickup 25, control circuit 26 and conductors corresponding to those shown in FIG. 1, but also carries other printed conductors which comprise the heater. Specifically, the latter includes heating element 22, specifically formed with horizontal conductors 22a that run into lateral collectors 22b. These collectors are, in turn, connected to control circuit 26 which supplies them with current. A moisture detector 23 consisting of two overlapping electrodes is inserted under the lowest of conductors 22a and is connected to control circuit 26 by a line 24 that ends at a broadened area 27.

Control circuit 26 is a single-piece integrated circuit similar to control circuit 6; however, it comprises additional circuitry and control functions for starting and stopping heating element 22. It can also serve other functions such as, for example, sounding an alarm whenever the window glass is broken. This is readily accomplished by incorporating a detector in the surface of the window glass and connecting this detector to control circuit 26. This detector can be illustratively implemented as a strong conductive strip formed, for example, in a shape of a loop which is printed and fired on the surface of the glass. Whenever the detector breaks, which is indicative of a simultaneously occurring break in the window glass, this detector signals control circuit 26 which in turn triggers the emission of an alarm signal.

Connection line 28, broadened at its end in an area 29 is, as shown in FIG. 2, placed between collector 22b, located on the left side of the window, and the left vertical edge of glass 21. Contact areas 31 and 32 and their respective connection lines 33 and 34, with their terminating connection areas 35 and 36, also exist in the area between connection line 28 and left-side collector 22b.

Connection areas 37 facilitate the connection of a cable that leads from the battery to control circuit 26. Areas 38 connect the drive voltage produced by control circuit 26 to a power stage which in turn provides the voltage for the drive motor. Terminals 40, equipped with plugs 40a, on which solderless connecting lugs can be attached, are affixed to areas 37 and 38. (See FIG. 4). Connection areas 39 on the extensions of collectors 22b serve to supply electrical current to the heating element.

Figure 4:
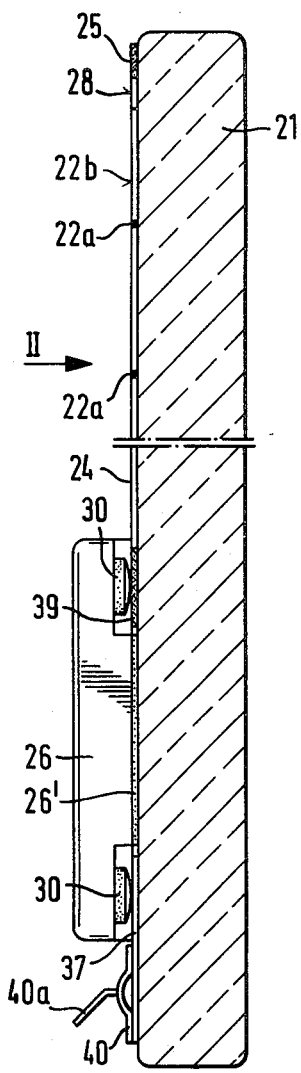
FIG. 4 is a sectional view taken along line IV—IV and in the direction of the arrows, both shown in FIG. 2.

Control circuit 26—advantageously an integrated circuit package—is equipped with elastic or spring contact posts 30 which rest, as shown in FIG. 4, on connection areas 37, 38 and 39. This circuit is permanently fixed to glass 21 by a layer of glue 26'. All the conductors (shown in FIGS. 3 and 4) and their connection areas; pickup 25; connection lines 28, 33 and 34; moisture pickup 23 and its connection line 24; contact areas 27, 29, 35, 36 and 39; and conductors 22a and collectors 22b of heating element 22, are made from the same electro-conductive material and are all silk-screened in a single operation onto the surface of the glass and thereafter fired during the reheating operation which is used temper the window glass.

Figure 5:
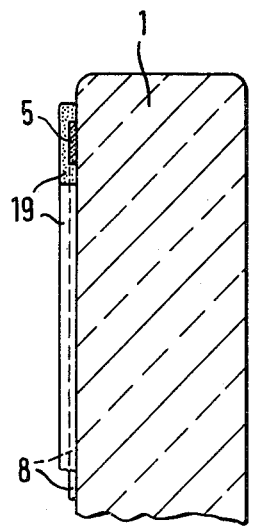
FIG. 5 is a cross-sectional view of a vehicular window carrying a conductive strip covered with a ceramic protective layer.

To protect the conductive strips from corrosion due to moisture or from wear resulting from physical contact, a coating or layer of electrically insulating enamel is applied over all the strips. FIG. 5 depicts such an arrangement. There, glass 1 carries a pickup 5 and a connection line 8, both covered with a protective layer 19. The protective layer 19 need not be much wider than the conductors 5 and 8 that it must protect. This layer is placed over the conductive strips as soon as the conductive strips have been silkscreened onto the window glass and have dried. Thereafter the two layers, i.e, the conductive strips and the protective layer, are fired at the same time. In order that the respective qualities of these two layers are not adversely affected, the compositions of each of these layers must be chemically compatible with the other.

FIGS. 6 and 7 show details of another embodiment of this invention and, more particularly, an automotive window in which a connection line running the entire vertical edge of the window glass is not needed to sense the height of the window. Specifically, contact areas 51 and 52 are connected to switching line 53 and 54, respectively. An auxiliary conduction line 55 connects contact areas 51' and 52' to the control circuit. A sliding contact, e.g. a conductive post or stud 56, is placed in the window frame (see FIG. 7). This stud can bridge the gap between contacts 51 and 51', for example. Thus, it can connect contact areas 51 to 51' and 52 to 52' thereby connecting line 55 to either line 53 or line 54, depending upon the height of the window glass. Sliding stud 56, for example, is advantageously made of graphite or a material with a graphite base impregnated with silver, and is embedded in an elastic material of section 57. This material is itself carried by post 58 which is used to guide the movement of the glass. By a suitable choice of material, sliding stud 56 can be made elastic which will advantageously avoid having to mount it on pressure springs, as would otherwise be necessary. A vertical connection line 48, running near the left hand edge 41 of the window glass is used to connect the capacitance pickup (not shown in FIG. 6) to the control circuit (also not shown). Conductive areas 51, 51', 52 and 52' are used to sense the height of the window.

A protective layer 59, as shown, in FIGS. 6 and 7, is applied, for reasons previously discussed, over all the conducting lines. However, contact areas 51, 51', 52 and 52' are left bare such that stud 56 can connect the appropriate areas as the window is raised or lowered.

Figure 8:
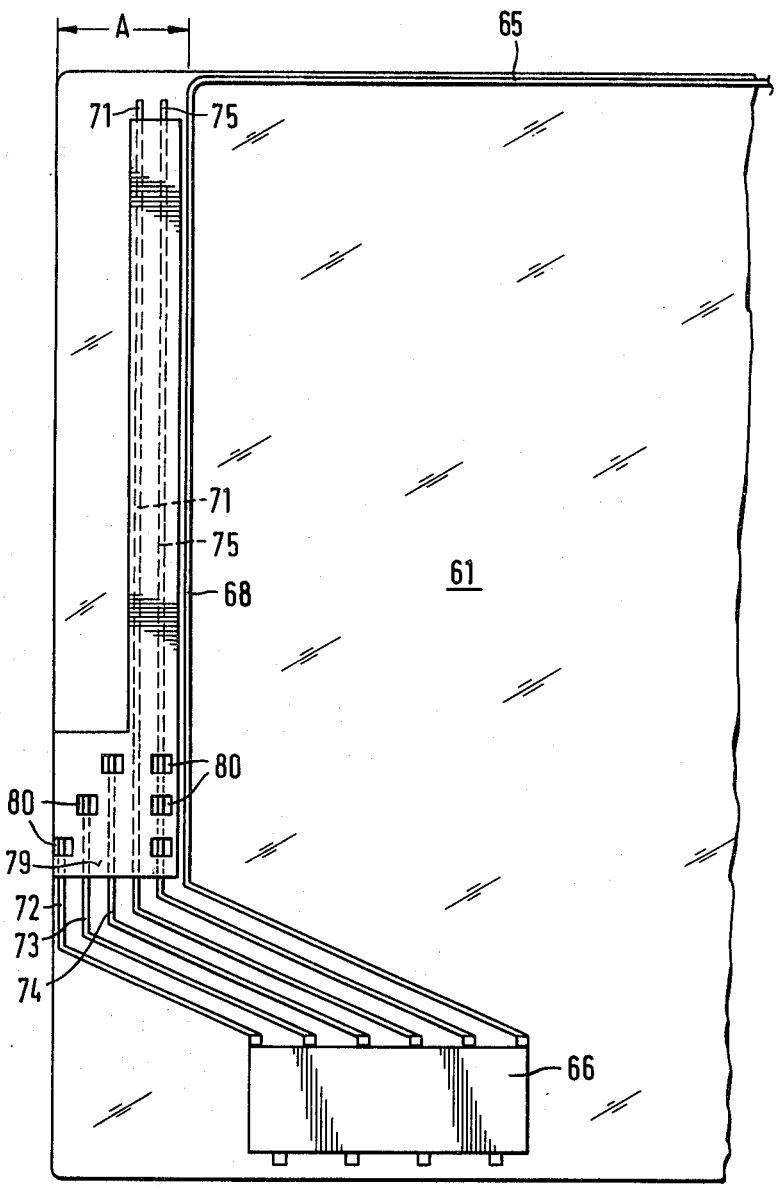
FIG. 8 is a view of a vehicular window containing another embodiment according to the principles of the instant invention.

In the embodiment depicted in FIG. 8, window glass 61 carries a control element 66 which comprises an integrated circuit. This control circuit is connected to pickup 65 by connection line 68 and is also connected to five other connecting lines 71-75. These five lines are covered with the ceramic insulating layer 79 which, at its upper end, exposes conductors 71 and 75 and at its lower end exposes areas 80. A sliding stud (similar to that shown in FIG. 7) is placed in the window frame and is used to connect lines 71-74 to line 75, depending upon height of the window glass. Line 71 is connected to the end of travel contact of the window in the fully opened position, while line 72 is connected to a contact area used to establish the end of travel contact of the window in the fully closed position. The sucessive connection of lines 73 and 74 makes it possible to advantageously vary the sensitivity of the detection circuit, such that the capacitive influence of the window frame on the pickup, in the final closing phase, is eliminated. As a result, the control circuit will continue to close the window without this movement being influenced by the window frame.

Thus, many and varied arrangements incorporating the teachings of the present invention may be devised by those skilled in the art without departing from the spirit and scope of the invention.

What is claimed is:

1. An electrically operated sliding window equipped with a saftety device, said safety device comprising:
   electrical contacts located on a surface of said window and along the edge of the window for sensing the height of the window,
   electrical conductors, in the form of a conductive strip, fabricated from substantially the same material as said contacts and located on a surface of said window, for connecting said contacts to an electrical control circuit, and
   said electrical control circuit, attached to a surface of said window in a stationary positional relationship with respect to said contacts and said conductors, for controlling the height of said window.

2. An electrically operated sliding window equipped with a safety device, said safety device comprising:
   electrical contacts located on a surface of said window and along the edge of the window for sensing the height of the window,
   electrical conductors, in the form of a conductive strip, fabricated from substantially the same material as said contacts and located on a surface of said window, for connecting said contacts to an electrical control circuit, and
   said electrical control circuit, having at least one integrated circuit, attached to a surface of said window in a stationary positional relationship with respect to said contacts and said conductors, for controlling the height of said window.

3. The invention in claim 2 in which said conductors are further comprised of connection areas located in the vicinity of said integrated circuit.

4. The invention in claim 3 in which said conductors are covered with a protective insulating layer.

5. The invention in claim 4 in which said window is further comprised of a heating element formed with horizontal conductors that run into lateral conductive collectors which are, in turn, connected to said electrical control circuit which applies electrical current to the heating element.

6. The invention in claim 1 in which said conductors are further comprised of connection areas located in the vicinity of said electrical control circuit.

7. The invention in claim 6 in which said conductors are covered with a protective insulating layer.

8. The invention in claim 7 in which said window is further comprised of a heating element formed with horizontal conductors that run into lateral conductive collectors which are in turn connected to said electrical control circuit which applies electrical current to the heating element.

* * * * *